United States Patent [19]

Antonen

[11] Patent Number: 4,592,928

[45] Date of Patent: Jun. 3, 1986

[54] METHOD AND COMPOSITIONS FOR INHIBITING LEAKAGE CURRENT IN SILICON DIODES

[75] Inventor: Robert C. Antonen, San Ramon, Calif.

[73] Assignee: Dow Corning Corporation, Midland, Mich.

[21] Appl. No.: 690,089

[22] Filed: Jan. 9, 1985

[51] Int. Cl.$^4$ .............................................. C08L 83/04
[52] U.S. Cl. ...................................... 427/93; 427/387; 524/425; 524/788; 357/72
[58] Field of Search .................... 427/93, 387; 357/72; 524/425, 788

[56] References Cited

U.S. PATENT DOCUMENTS

| | | | |
|---|---|---|---|
| 3,684,952 | 8/1972 | Chang et al. | 148/33.3 |
| 3,946,427 | 3/1976 | Iwasawa et al. | 357/72 |
| 4,017,495 | 4/1977 | Jaffe et al. | 264/272 |

FOREIGN PATENT DOCUMENTS

| | | |
|---|---|---|
| 835590 | 2/1970 | Canada . |
| 70052 | 5/1980 | Japan . |

Primary Examiner—Lewis T. Jacobs
Attorney, Agent, or Firm—Robert Spector

[57] ABSTRACT

Peroxide curable organosiloxane elastomer compositions where from 0.1 to 10 mole percent of the silicon-bonded hydrocarbon radicals are phenyl improve the leakage current resistance of silicon diodes when the compositions are applied to these devices as junction coatings.

15 Claims, No Drawings

METHOD AND COMPOSITIONS FOR INHIBITING LEAKAGE CURRENT IN SILICON DIODES

BACKGROUND OF THE INVENTION

1. Field of the Invention

This invention relates to coating materials for semiconductor devices. More particularly, this invention relates to a class of peroxide-curable organosiloxane elastomer compositions useful as junction coatings for silicon diodes. These cured compositions inhibit leakage current under conditions of high inverse voltage and elevated temperature.

2. Background Information

Silicon diodes are used in a variety of electric and electronic devices as rectifiers and for other applications. One type of diode is formed by bonding together substantially equidimensional wafers of N and P types of silicon to form a PN junction. Electrical conductors are then bonded to the silicon wafers. The wafers are subsequently coated with materials, referred to in the art as junction coatings, to protect the sensitive PN junction area against contact with water and other impurities that can substantially alter the electrical properties of the diode. If the diode is exposed to substantial variations in temperature, the junction coating should be sufficiently elastomeric to expand and contract along with the diode without cracking or spalling.

Moisture curable and peroxide curable organosiloxane elastomer compositions are disclosed as junction coatings for semiconductor devices. The polymerizable materials in these coating compositions are polydimethylsiloxanes containing either terminal hydroxyl groups in moisture curable compositions or triorganosiloxy terminal units in peroxide curable compositions. The shortcoming of these compositions is their inability to prevent leakage currents at inverse voltages in excess of about 600 volts when the diode is exposed to temperatures of 100° C. or higher. It is believed that the major portion of these leakage currents pass through the junction coating rather than between the two silicon wafers.

The use of moisture curable silicone elastomers as coatings to reduce leakage current in silicon diodes and thyristors is disclosed in Japanese Patent Publication (Koki) No. 70,052/80, which was published on May 27, 1980. In accordance with the teaching of this publication, a mixture that includes a hydroxyl endblocked polydiorganosiloxane, an alkoxysilane and a tin-containing catalyst is applied to a semiconductor device and allowed to cure in the presence of atmospheric moisture.

The application to integrated circuit "chips" of moisture curable silicone elastomers dispersed in organic solvents is disclosed in U.S. Pat. No. 4,017,495, which issued to Jaffe et al. on Apr. 12, 1977. Moisture curable silicone compositions often require a catalyst to promote curing. The presence of these catalysts and residual moisture in the final coating can cause excessively large leakage currents to develop in the semiconductor device.

Another conventional type of silicone elastomer composition is heat curable and contains an organic peroxide as the curing agent. These compositions can be either a liquid or a semisolid "gum" and typically include a polydiorganosiloxane, a filler such as silica and an organic peroxide. The polydiorganosiloxane may contain ethylenically unsaturated hydrocarbon radicals such as vinyl bonded to the silicon atoms of the polymer.

Data in the example that forms part of this specification demonstrate that a commercially available peroxide-curable polydimethylsiloxane elastomer recommended for use as a junction coating composition exhibits a significant leakage current when the device is subjected to an inverse voltage of 1000 volts D.C. at elevated temperatures for an extended time period.

U.S. Pat. No. 3,946,427, which issued to Iwasawa et al. on Mar. 23, 1976, discloses that the molar ratio of methyl to phenyl radicals in a silicone resin used as a junction coating for semiconductor devices should be at least 20:1 to prevent development of leakage currents. Patentees' theory is that the presence of the highly electronegative phenyl radical is responsible for the leakage current observed when a semiconductor device is exposed to temperatures of about 100° C.

Earlier prior art discloses the advisability of including up to 80 percent by volume of phenyl-containing chlorosilanes in organosilane mixtures that are hydrolyzed to yield silicone resins useful as passivation or barrier coatings on semiconductor devices. U.S. Pat. No. 3,684,592, which issued to Chang et al. on Aug. 15, 1972, discloses silicone resin precursors containing from 50 to 100 parts by volume of diphenyldichlorosilane and from 25 to 50 parts by volume of methyltrichlorosilane. The resin is used to form passivation layers on semiconductor devices.

Canadian Pat. No. 835,590, which issued to Lee on Feb. 24, 1970, discloses barrier coatings for semiconductor devices. The coatings contain a methylphenylsiloxane resin represented by the average unit formula $R_nSiO_{(4-n)/2}$ where R is methyl or phenyl, n is from 1.1 to 1.75 and the resin contains from 0.5 to 5.0 phenyl radicals per methyl radical.

SUMMARY OF THE INVENTION

It has now been found that when a prior art peroxide-curable polydimethylsiloxane composition recommended for use as a junction coating for silicon diodes is modified by replacing a small percentage of the silicon-bonded methyl radicals in the composition with phenyl radicals, leakage currents in silicon diodes coated with these compositions and subsequently exposed to inverse voltages of about 1000 volts D.C. at elevated temperatures are reduced to less than 20 microamperes.

DETAILED DESCRIPTION OF THE INVENTION

This invention provides a method for increasing the resistance of silicon diodes to leakage currents, said method comprising (I) applying to the junction area of said diodes a peroxide curable, elastomeric coating composition consisting essentially of (a) at least one triorganosiloxy-endblocked polydiorganosiloxane exhibiting a viscosity of 0.1 to 500 Pa.s at 25° C. wherein the diorganosiloxane units present in (a) comprise dialkylsiloxane units and at least one member selected from the group consisting of phenylalkylsiloxane and diphenylsiloxane units, where phenyl radicals constitute from 0.1 to 10 mole percent of the organic radicals present in said diorganosiloxane units and where said alkyl radicals contain from 1 to 4 carbon atoms, (b) from 10 to 70 percent, based on the total weight of said composition, of a nonconductive filler, and (c) an organic peroxide in an amount sufficient to convert said composition to a cured elastomer at temperatures above 100° C., and (II) heating said composition at a temperature above 100° C. for a time period sufficient to convert said composition to a cured elastomer.

This invention also provides a preferred class of junction coating compositions wherein the aforementioned filler is calcium carbonate and is present in an amount sufficient to impart thixotropic flow properties to said composition. As used herein, the term "thixotropic" implies that the composition does not flow significantly under zero shear at 25° C. and exhibits a Brookfield viscosity of from 50 to 170 Pa.s at 25° C. and at a spindle speed of five revolutions per minute.

The curable portion of the present junction coating compositions includes one or more triorganosiloxy-endblocked polydiorganosiloxanes. To achieve sufficient resistance to leakage currents in semiconductor devices exposed to inverse voltages of about 1000 volts at elevated temperatures, from 0.1 to 10 mole percent, preferably 0.5 to 5 mole percent of the organic radicals in the diorganosiloxane units are phenyl radicals that are present as diphenylsiloxane or phenylalkylsiloxane units. The remaining organic radicals include alkyl containing from one to four carbon atoms and ethylenically unsaturated hydrocarbon radicals such as vinyl and allyl. Suitable alkyl radicals include methyl, ethyl, propyl and butyl. The alkyl radicals are preferably methyl, based on the cost and availability of the intermediates used to prepare the polydiorganosiloxanes.

If it is difficult or inconvenient to obtain a diorganosiloxane copolymer containing a sufficiently low concentration of phenylalkylsiloxane and/or diphenylsiloxane units, the curable portion of the present coating composition can be a mixture of a liquid triorganosiloxy endblocked copolymer containing more than 10 mole percent of silicon-bonded phenyl radicals and a quantity of a liquid triorganosiloxy endblocked polydialkylsiloxane sufficient to achieve a concentration of phenyl radicals in the mixture of from 0.1 to 10 mole percent, based on the total number of silicon-bonded hydrocarbon radicals.

The terminal groups of the polyorganosiloxanes can be any that will not interfere with a peroxide catalyzed curing of these polymers, are unreactive with the materials present on the semiconductor device being coated and will not introduce materials, such as water, that could adversely affect the electrical properties of the device. Triorganosiloxy terminal groups such as trimethylsiloxy are preferred. To facilitate curing of the polydiorganosiloxane(s), the terminal groups are preferably dimethylvinylsiloxy or phenylmethylvinylsiloxy. As disclosed hereinabove, a small concentration of vinyl or allyl groups may be present in the diorganosiloxane units of the polymers.

The viscosity of the polydiorganosiloxane portion of the present coating compositions can be from 0.1 to 500 Pa.s. The optimum viscosity range for a given composition is one that will yield a final composition that can be applied in the desired thickness onto the surface of a silicon diode junction. Nonthixotropic compositions typically exhibit viscosities of from about 0.5 to 100 Pa.s at 25° C. Preferably the polydiorganosiloxane component exhibits a viscosity of from 5 to 15 Pa.s. Those skilled in the art will realize that the viscosity of the polydiorganosiloxane(s) required to prepare junction coating compositions useful in practicing the present method will depend, at least in part, upon the type and concentration of filler.

Liquid triorganosiloxy endblocked polydimethylsiloxanes and dimethylsiloxane/phenylmethylsiloxane copolymers are available in a range of viscosities or these polymers can be synthesized using known methods.

The present compositions also contain an organoperoxide that initiates curing of the polydiorganosiloxane(s) by generating free radicals at temperatures above about 100° C. The particular organoperoxide selected will be determined, at least in part, by the temperature at which the present coating compositions are cured. One preferred class of organoperoxides are derived from substituted and unsubstituted benzoic acids, and includes benzoyl peroxide and chlorinated derivatives thereof, such as 2,4-dichlorobenzoyl peroxide.

Another class of useful organoperoxides react preferentially with ethylenically unsaturated hydrocarbon radicals. This class includes aliphatic peroxides such as di-t-butylperoxide and 2,5-bis(tert-butylperoxy)-2,5-dimethylhexane. It will be understood that when these peroxides are used, the polydiorganosiloxane(s) should contain vinyl radicals.

The concentration of organoperoxide in the present compositions is sufficient to obtain a practical cure rate under the desired curing conditions, which are typically within the range from 100° to about 250° C. for a period of from several minutes or more. It may be desirable to post cure certain compositions. From one to about ten percent of an organoperoxide, based on the weight of the composition, is usually sufficient to meet this requirement.

In addition to at least one peroxide-curable liquid polydiorganosiloxane discussed hereinbefore and an organoperoxide, the present coating compositions also contain nonconducting reinforcing and/or nonreinforcing fillers to impart the required thixotropy and/or electrical properties to the composition. Typical fillers include fume silica, quartz, and calcium carbonate.

The addition of certain fillers such as fume silica to a polyorganosiloxane composition often results in a substantial increase in viscosity referred to as "crepe-hardening." To avoid this phenomenon, the filler is often treated with low molecular weight hydroxyl-endblocked polydiorganosiloxanes.

Filler treatment can be accomplished by mixing together the filler and treating agent to obtain a product that is subsequently blended with the other ingredients of the composition. Alternatively the treating agent can be blended together with untreated filler and the other ingredients of the composition to achieve "in-situ" treatment of the filler.

Calcium carbonate can be used in combination with effective amounts of treating agents such as alkyl orthosilicates or partial hydrolysis products such as ethyl polysilicate.

The filler typically constitutes from 10 to about 70 percent by weight of the composition. In preferred thixotropic compositions, the filler is calcium carbonate at a concentration of from 40 to 60 percent by weight. These preferred compositions are readily processible in conventional equipment, flow readily under moderate pressure and will not flow under zero shear. The type and amount of filler that will provide optimum flow properties in a particular polyorganosiloxane composition can be determined by those skilled in the art with only a minimum of routine experimentation.

The present compositions of this invention can contain relatively small amounts of volatile, nonreactive liquid diluents to facilitate processing and/or application of the composition or to improve the adhesion of the compositions to metals conventionally used to form the electrodes or other electrical connections to silicon diodes. Diluents of this type include volatile liquid hydrocarbons that boil slightly above ambient temperature, such as isobutane, pentane, hexane, and other volatile organic liquids such as ethers that will not interfere with curing of the compositions. Diluents can constitute up to 10 percent by weight of the present compositions.

The coating compositions of this invention can be prepared by homogeneously blending the polydiorganosiloxane(s) filler and peroxide, together with any optional ingredients which do not adversely affect the performance of the final coating as an electrical insulation. Such ingredients include diluents, filler treating agents, flame retardants, heat stabilizers, and pigments. Depending upon the desired end use application, the final composition can be flowable or thixotropic. Small batches can be mixed adequately by hand. Larger amounts typically require the use of mechanical mixing equipment such as planetary mixers. Thixotropic compositions can be processed in mixers of the type used for bakery dough.

The present compositions can be applied to various types of silicon diodes using any of the known coating techniques, including spraying, dipping and extrusion.

The coatings are cured by heating them at temperatures from 100° to about 300° C. for a period of time sufficient to decompose the peroxide and cure the coating to an elastomeric material.

The following example discloses a preferred thixotropic type of coating composition and compares the effectiveness of this composition in reducing leakage current in a silicon diode with the performance of a similar composition containing a dimethylsiloxane homopolymer as the sole polydiorganosiloxane component. All parts and percentages are by weight unless otherwise specified.

EXAMPLE

A thixotropic coating composition of this invention was prepared by blending together the following ingredients to form a homogeneous mixture:

41 parts of a dimethylvinylsiloxy endblocked polydimethylsiloxane exhibiting a viscosity of about 10 Pa.s at 25° C.;
53 parts of finely divided calcium carbonate;
3 parts of ethyl polysilicate; and
2.4 parts of 2,4-dichlorobenzoyl peroxide.

The resulting mixture (92.5 parts) was blended to homogeneity with 7.5 parts of a liquid methylphenylvinyl siloxy endblocked dimethylsiloxane/phenylmethylsiloxane copolymer. The copolymer exhibited a viscosity of 2 Pa.s at 25° C. and contained 7.5 mole percent phenylmethylsiloxane units and 92.5 mole percent dimethylsiloxane units, exclusive of terminal units. The final composition, referred to hereinafter as A, contained 1.3 mole percent of phenylmethylsiloxane units, based on the total number of diorganosiloxane units. The viscosity of the compositions was within the range from 80 to 85 Pa.s at 25° C., measured using a model HAT Brookfield viscometer equipped with a number 6 spindle rotating at five revolutions per minute. The spindle was allowed to rotate for three minutes before the viscosity reading was taken. The composition was considered thixotropic because it did not flow under zero shear.

The composition was applied as a junction coating to a silicon rectifier of the type referred to in the art as a "button diode."

The diode consisted of one wafer each of N type and P type silicon bonded to form a PN junction. A circular metal electrode larger in diameter than the wafers was bonded to the exposed side of each wafer in a concentric manner. The open area between the two electrodes was filled with the junction coating composition. The composition was cured by heating it from ambient temperature to a maximum temperature of 250° C. using a cycle time of from 20 to 25 minutes and subsequently post cured for 24 hours at 200° C. The coated diode was then encapsulated using a conventional molding compound.

Fifty diodes were tested for leakage current by applying an inverse voltage of 1000 volts D.C. for 168 hours during which time the diodes were heated at a temperature of 125° C. At the end of this period the leakage current in each of the diodes was measured. Any diode having a leakage current in excess of 20 microamperes was rejected. There were no rejections among the fifty diodes tested.

For comparative purposes, a second coating composition (referred to hereinafter as B) was prepared using the types and amounts of all but one of the ingredients described in the first part of this Example. In this instance the dimethylsiloxane/methylphenylsiloxane copolymer was omitted. This comparative composition has been used as a junction coating material. The comparative composition was applied to the same type of diode and subjected to the leakage current test described in this Example using the same current detecting device. A number of the fifty diodes tested exhibited leakage current in excess of 20 microamperes at the end of the testing period. The test was repeated to determine the highest inverse voltage at which the leakage current did not exceed 20 microamperes at the end of a 168-hour test period using a temperature of 125° C. This voltage was found to be about 6700 volts D.C.

These data demonstrate the higher resistance to leakage current imparted by a coating compositions of this invention (A) relative to a similar composition (B) which have previously been recommended for this purpose. Fifty diodes coated using composition (A) were also tested by subjecting them to a continuous series of "on-off" cycles for 1000 hours while heating them at a temperature of 125° C. The "on" and "off" periods were each one minute in duration and the applied voltage was 400 volts D.C. None of the diodes had leakage currents in excess of 200 microamperes at the end of this test.

That which is claimed is:
1. A method for increasing the resistance of silicon diodes to leakage currents, said method comprising
 (I) applying to the junction area of said diodes a peroxide curable, elastomeric coating composition consisting essentially of
  (a) at least one triorganosiloxy-endblocked polydiorganosiloxane exhibiting a viscosity of 0.1 to 500 Pa.s at 25° C. wherein the diorganosiloxane units present in (a) comprise dialkylsiloxane units and at least one member selected from the group consisting of phenylalkylsiloxane and diphenylsiloxane units, where phenyl radicals constitute from 0.1 to 10 mole percent of the silicon-bonded organic radicals of said diorganosiloxane units and where said alkyl radicals contain from 1 to 4 carbon atoms, (b) from 10 to 70 percent, based on the total weight of said composition, of a nonconductive filler, and (c) an organic peroxide in an amount sufficient to convert said composition to a cured elastomer at temperatures above 100° C., and (II) heating said composition at a temperature above 100° C. for a time period sufficient to convert said composition to a cured elastomer.

2. The method of claim 1 where (a) consists essentially of a triorganosiloxy endblocked polydimethylsiloxane and a triorganosiloxy endblocked copolymer containing dimethylsiloxane units and either diphenylsiloxane or phenylmethylsiloxane units.

3. The method of claim 2 where said copolymer contains a concentration of phenylmethylsiloxane units equivalent to 0.5 to 5 mole percent phenyl radicals based on the total number of silicon-bonded hydrocarbon radicals in said composition.

4. The method of claim 1 where the viscosity of (a) is from 5 to 15 Pa.s at 25° C.

5. The method of claim 1 where the triorganosiloxy units are trimethylsiloxy, phenylmethylvinylsiloxy or dimethylvinylsiloxy.

6. The method of claim 1 where said filler is calcium carbonate.

7. The method of claim 6 where said composition is thixotropic and contains a mixture of from 40 to 60 percent by weight of calcium carbonate and an amount of ethyl polysilicate sufficient to treat the filler.

8. The method of claim 7 where said composition exhibits a Brookfield viscosity of from 50 to 170 Pa.s at 25° C., measured using a spindle speed of five revolutions per minute.

9. The method of claim 1 where said composition includes a nonreactive, volatile diluent in an amount of up to 10 weight percent, based on the weight of said composition.

10. A thixotropic, heat curable elastomer composition consisting essentially of (a) at least one triorganosiloxy endblocked polydiorganosiloxane exhibiting a viscosity of from 0.1 to 500 Pa.s at 25° C. wherein the diorganosiloxane units present in (a) comprise dialkylsiloxane and at least one member selected from the group consisting of diphenylsiloxane and phenylalkylsiloxane units, from 0.1 to 10 mole percent of the silicon-bonded organic radicals of said diorganosiloxane units are phenyl and the alkyl radicals contain from one to four carbon atoms;

(b) calcium carbonate in an amount sufficient to impart thixotropy to said curable composition, whereby said curable composition is substantially nonflowing under zero shear at 25° C. and exhibits a Brookfield viscosity of from 50 to 170 Pa.s at 25° C. and at a spindle speed of five revolutions per minute; and (c) an amount of an organic peroxide sufficient to convert said curable composition to an elastomer at temperatures above 100° C.

11. The composition of claim 9 where (a) consists essentially of a triorganosiloxy endblocked polydimethylsiloxane and a triorganosiloxy endblocked copolymer containing dimethylsiloxane units and either diphenylsiloxane or phenylmethylsiloxane units.

12. The composition of claim 11 wherein said copolymer contains a concentration of phenylmethylsiloxane units equivalent to 0.5 to 5 mole percent phenyl radicals based on the total number of silicon-bonded hydrocarbon radicals in said composition.

13. The composition of claim 10 where the combined viscosity of the polydiorganosiloxanes present in (a) is from 5 to 15 Pa.s at 25° C.

14. The composition of claim 10 where the triorganosiloxy units are trimethylsiloxy, phenylmethylvinylsiloxy or dimethylvinylsiloxy units.

15. The composition of claim 10 where said calcium carbonate is present in combination with an effective amount of ethyl silicate as a treating agent and constitutes from 40 to 60 percent by weight of said composition.

* * * * *